(12) United States Patent
MacDonald et al.

(10) Patent No.: US 7,420,401 B2
(45) Date of Patent: Sep. 2, 2008

(54) LOW PIN COUNT RESET CONFIGURATION

(75) Inventors: Colin MacDonald, Austin, TX (US);
Alan J. Carlin, Austin, TX (US); Chris C. Dao, Pflugerville, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 42 days.

(21) Appl. No.: 11/453,324

(22) Filed: Jun. 14, 2006

(65) Prior Publication Data
US 2007/0290731 A1    Dec. 20, 2007

(51) Int. Cl.
*H03K 3/02* (2006.01)
(52) U.S. Cl. ....................................... 327/198
(58) Field of Classification Search ............... None
See application file for complete search history.

(56) References Cited

U.S. PATENT DOCUMENTS

| 6,804,503 B2* | 10/2004 | Shohara et al. | .......... 455/343.4 |
| 6,842,082 B2* | 1/2005 | Tan | .............................. 331/175 |
| 6,937,028 B2* | 8/2005 | Tan | .............................. 324/601 |

* cited by examiner

*Primary Examiner*—N. Drew Richards
*Assistant Examiner*—Patrick O'Neill
(74) *Attorney, Agent, or Firm*—Dillon & Yudell LLP

(57) ABSTRACT

An integrated circuit is configured with a pin for specifying a reset configuration vector of a circuitry within the integrated circuit. The resistance value of a low cost external resistor coupled to the pin is detected and utilized to identify the configuration. Logic on the integrated circuit detects and utilizes the resistor value to index to a configuration vector in a look-up table. The integrated circuit is then configured in accordance with the indexed configuration vector.

24 Claims, 3 Drawing Sheets

LOW PIN COUNT RESET CONFIGURATION

BACKGROUND OF THE INVENTION

1. Field of the Invention

The invention relates generally to integrated circuit devices, and particularly to configuring an integrated circuit that utilizes a low pin count.

2. Description of the Related Art

With the need to provide a common integrated circuit for multiple purposes and to help facilitate unit testing, integrated circuits are commonly designed to function in different modes of operation. The parameters that dictate how the integrated circuit is to function are called a configuration vector and include settings such as input/output bus port width, pad drive strength, test mode, and any functional sub-modes.

During a power-on-reset sequence, a circuitry utilizes a reset configuration vector to specify operating parameters. In some devices, the reset configuration vector is communicated to the circuitry through a set of external pins (typically 4-8) that are driven high or low. These same devices require a relatively costly external integrated circuit to isolate the circuitry pads from the power-on-reset level drivers.

Manufacturers, in a goal to produce smaller and more powerful products, have limited space in their products for integrated circuits. Therefore, in addition to being economically costly, the external integrated circuit consumes board real estate that might not be available or that could be utilized for other functions.

Integrated circuits are becoming increasing complex and are requiring more and more pins to expose this functionality to external circuitry. The number of pins that may be utilized for establishing the configuration vector is decreasing.

To reduce the relatively costly external integrated circuit to establish the configuration vector and to handle the decreasing number of pins available, there exists a need for a new and improved method and apparatus for specifying the configuration vector for a system implemented on an integrated circuit.

BRIEF DESCRIPTION OF THE DRAWINGS

This invention is described in a preferred embodiment in the following description with reference to the drawings, in which like numbers represent the same or similar elements, as follows.

In the following detailed description of exemplary embodiments of the invention, reference is made to the accompanying drawings, which form a part hereof, and in which is shown by way of illustration of specific exemplary embodiments in which the invention may be practiced.

DETAILED DESCRIPTION OF PREFERRED EMBODIMENTS

In the following detailed description of exemplary embodiments of the invention, specific exemplary embodiments in which the invention may be practiced are described in sufficient detail to enable those skilled in the art to practice the invention, but it is to be understood that other embodiments may be utilized and that logical, architectural, programmatic, mechanical, electrical and other changes may be made without departing from the spirit or scope of the present invention. Further, elements or steps, or combinations thereof that produce equivalent results as those described below may be utilized without departing from the scope of the invention. The following detailed description is, therefore, not to be taken in a limiting sense, and the scope of the present invention is defined only by the appended claims and their equivalents.

Figure 1:
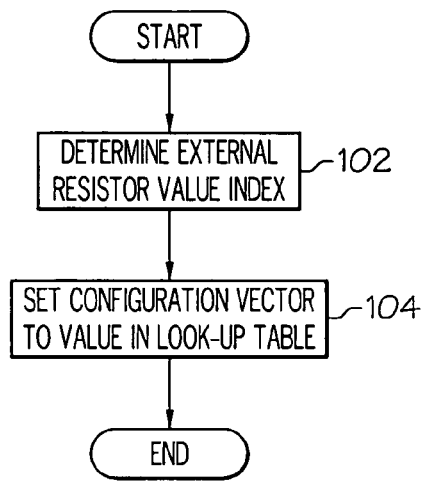
FIG. 1 shows a flow diagram of a method for configuring circuitry in accordance with a preferred embodiment of the present invention.

With reference now to the figures, and in particular with reference to FIG. 1, there is shown a flow diagram of a method for configuring a circuitry in accordance with a preferred embodiment of the present invention.

Figure 2:
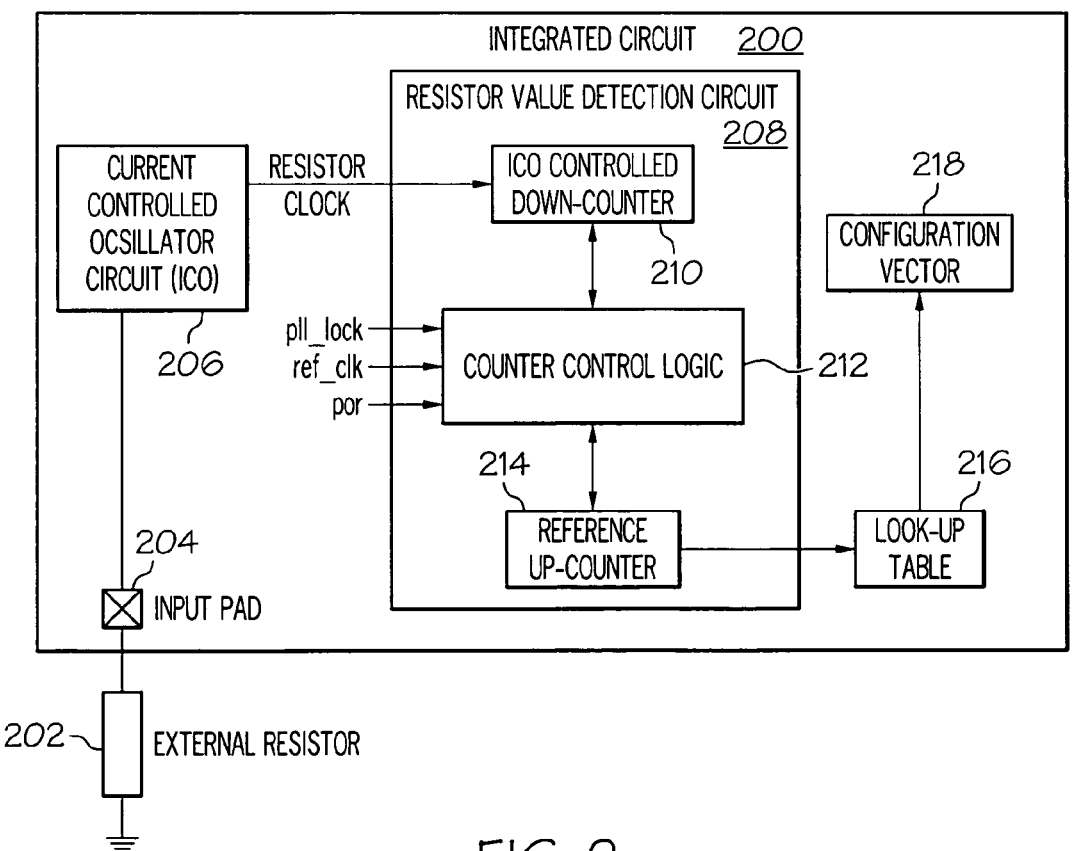
FIG. 2 illustrates a block diagram for configurable circuitry utilizing an external resistor and single pin in accordance with a preferred embodiment of the present invention.
Figure 3:
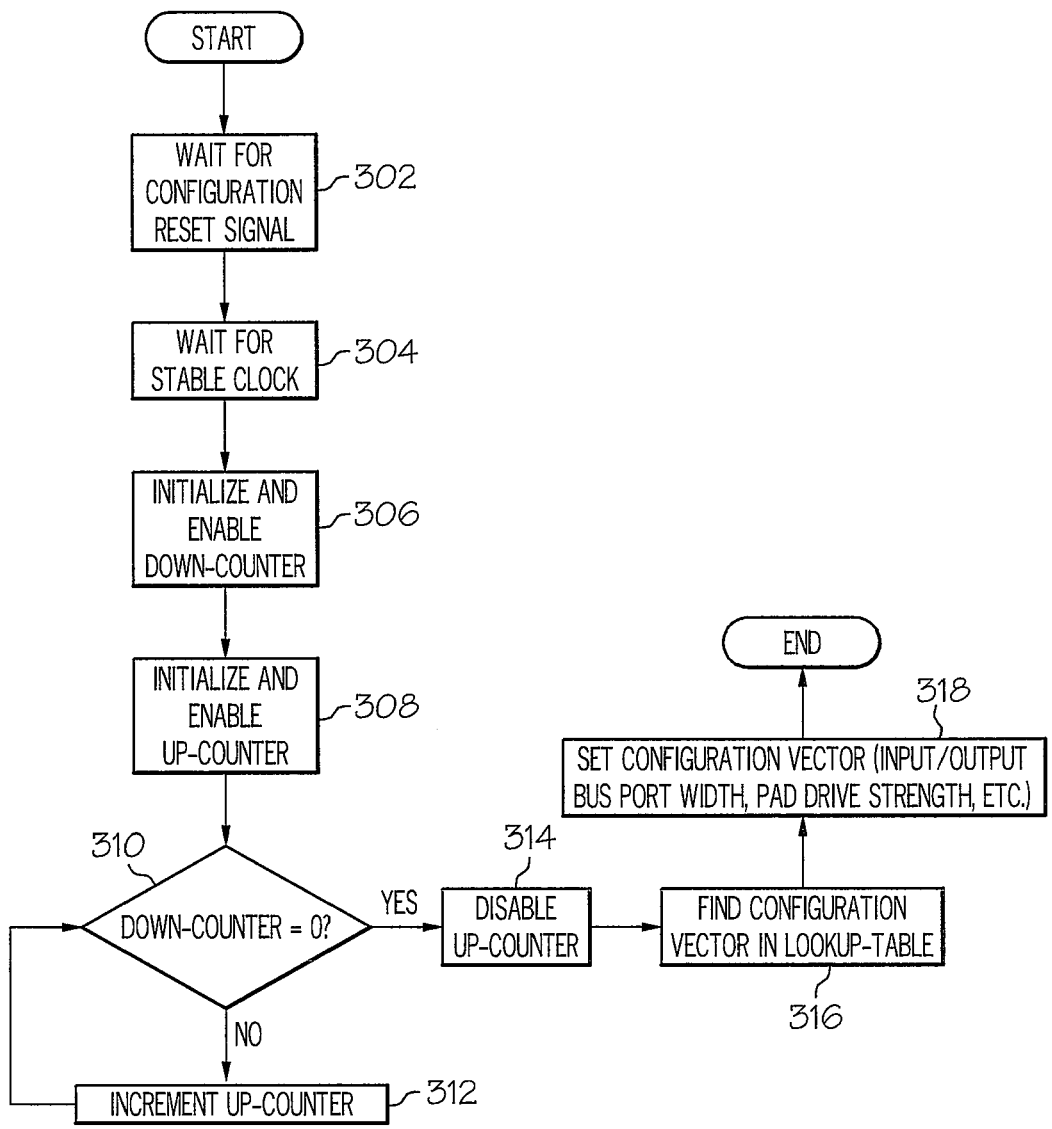
FIG. 3 depicts a flow diagram for the logic for detecting the value of the external resistor and initializing the configuration vector for the block diagram illustrated in FIG. 2.

The process begins at Step 102 where the system determines the value of an external resistor. The value of the external resistor is associated to an index in a look-up table. For the purposes of the preferred embodiment, the resistor value and the index in the look-up table are interchangeable values since there is a known mapping between the two. FIG. 2 and FIG. 3 show in more detail a preferred method for determining the resistor value.

A preferred embodiment utilizes only a single configuration pin connected to the integrated circuit to establish a multi-bit configuration vector, while prior art solutions utilize data to indicate the multi-bit configuration. Further, the external resistor is a relatively low-cost element compared to additional integrated circuits traditionally used to supply a multi-bit configuration vector.

Once the resistor value has been determined, the process advances to Step 104 where the circuitry sets its configuration vector based on the resistor value index into the look-up table. The device then begins operating as specified in the configuration vector.

The device contains a table or other storage mechanism for hosting a plurality of possible configuration vectors. Each of the possible configuration vectors is associated with an index. In the case of a table, the index would be a table index or row in the table. The external resistor value maps to an index in the table. By mapping resistor values to configuration vector entries in the table, the circuitry may be configured by changing the value of the low-cost external resistor.

With reference now to FIG. 2, there is illustrated a block diagram for configurable circuitry utilizing an external resistor and single pin in accordance with a preferred embodiment of the present invention.

Integrated Circuit 200 comprises Input Pad 204, Current Controlled Oscillator Circuit 206, Resistor Value Detection Circuit 208, Look-up Table 216, and Configuration Vector 218.

Integrated Circuit 200 is connected to External Resistor 202 via Input Pad 204. External Resistor 202 is connected to ground. The value of External Resistor 202 controls the amount of current flowing through Current Controlled Oscillator Circuit 206. The value of External Resistor 202 is the only part of the circuit that needs to be changed in order to select a specific configuration vector.

Current Controlled Oscillator Circuit 206 increases in frequency monotonically with respect to the value of External Resistor 202. A detailed block diagram of a preferred current controlled oscillator circuit is provided in FIG. 4. While a current controlled oscillator is shown in a preferred embodiment, alternative embodiments may utilize a voltage controlled oscillator, in a manner that will be readily apparent to those skilled in the art. The output of Current Controlled Oscillator Circuit 206 is a clock signal herein referred to as the resistor clock. Resistor values for External Resistor 202 should be chosen to prevent frequency overlap from Current Controlled Oscillator Circuit 206. Frequency overlap is avoided by adequately spacing resistor values. Additionally, resistor values should not be spaced further apart than necessary or Current Controlled Oscillator Circuit 206 will have to operate at an unnecessarily large range of frequencies.

The resistor clock is an input to Resistor Value Detection Circuit 208. The resistor clock represents the frequency output from Current Controlled Oscillator 206 that is dependant upon External Resistor 202. In a preferred embodiment, Resistor Value Detection Circuit 208 comprises Current Controlled Down-Counter 210, Counter Control Logic 212, and Reference Up-Counter 214. A flow diagram illustrating the method employed by Resistor Value Detection Circuit 208 is provided in FIG. 3.

Those skilled in the art will readily appreciate that a functionally equivalent circuit for Resistor 202 and Current Controlled Oscillator 206 may be created by utilizing an analog to digital converter, analog to digital converter with a pulse width modulator, and other on-chip logic in combination with an external resistor, voltage divider, resistor-capacitor network, FET, BJT, diode, triode, etc. Any component or set of components capable of generating a reference or bias current or voltage, or with a predictable voltage/current relationship, is understood to be functionally equivalent and may be utilized for alternative preferred embodiments.

Counter Control Logic 212 receives a Power-on-Reset signal (por), a Reference Clock (ref_clk), and a Stable Clock signal (pll_lock). Counter Control Logic 212 is connected to Current Controlled Down Counter 210 and Reference Up-Counter 214.

After receiving a Power-on-Reset signal, Counter Control Logic 212 waits for a Stable Clock signal. Once a stable clock signal is present, Counter Control Logic begins determining the value of External Resistor 202 by initializing and enabling Current Controlled Down-Counter 210 and Reference Up-Counter 214. Reference Up-Counter 214 is set to 0 and Current Controlled Down-Counter 210 is set to its maximum value.

While determining the value of External Resistor 202, Counter Control Logic 212 increments Reference Up-Counter 214 on each reference clock signal cycle (ref_clk). Meanwhile, Current Controlled Down-Counter 210 is decremented by Counter Control Logic 212 at the frequency of the resistor clock. By utilizing the combination of an up-counter and a down-counter, Resistor Value Detection Circuit 208 is able to use the counter value to uniquely map to a single possible value of External Resistor 202, provided resistor values are chosen that do not produce overlapping frequencies. For example, if Current Controlled Down-Counter 210 has a maximum value of 1000, and is decremented to 0, it counts down over a period of time that is a function of the frequency of the resistor clock. At the termination of the countdown, the Reference Up-Counter 214 has been counting a number of cycles of a known reference frequency over the same time period of the countdown. This number is used as an index value to identify an associated configuration value. Because a different frequency of the resistor clock results from each possible resistor value, a unique index value will correspond to the number of resistor clock cycles received in the defined period of time (i.e. index value=ref_clk*1000/frequency of the resistor clock).

Counter Control Logic 212 disables Current Controlled Down-Counter 210 and Reference Up-Counter 214 when the value of Current Controlled Down-Counter 210 reaches the termination value of 0. The value stored in Reference Up-Counter 214 is then utilized to find an entry in Look-up Table 216 for the desired configuration vector. A higher the resistor clock frequency results in a higher index value in Look-up Table 216.

Configuration Vector 218 for Integrated Circuit 200 is then set to the configuration value stored in Look-up Table 216 that matches the detected resistor value of External Resistor 202. By means of example, Configuration Vector 218 includes bits for the input/output bus port width, pad drive strength, and if the integrated circuit is to operate in test mode. In other embodiments, Configuration Vector 218 may include any parameter that dictates how the integrated circuit is to operate internally and/or interact with other devices. Following Configuration Vector 218 being set to the desired value from Look-up Table 216, Integrated Circuit 200 operates in accordance with the specified configuration vector.

While Resistor Value Detection Circuit 208 has been shown as comprising counters and control logic, those skilled in the art will readily appreciate that other circuitry may be utilized to perform the same intended function without departing from the spirit and scope of the invention. For example, in another embodiment of the present invention, an analog-to-digital convert may be utilized to determine the resistor value.

For the purposes of this application, the term "resistor value" includes the effective resistance of the external circuitry connected to Configuration Pin 204. Additionally, for the purposes of this application, the term "resistor detection circuitry" includes internal circuitry that determines a configuration vector index based upon the resistor value.

Look-up Table 216 has been described as a table, the equivalent functionality may be obtained by utilizing synthesized logic, parallel or serial comparator logic, a memory, or any other means of associating the count value with the resistor/component value or index.

While the system shown in FIG. 2 includes a single resistor connected to a single pin, other embodiments include a plurality of configuration pins, each connected to a resistor or a resistance element. In these embodiments, each pin is utilized to configure a portion of the configuration vector. In some of these embodiments, the functionality from resistor detection circuit is utilized in turn for each pin, and in others, each pin is connected to a dedicated resistor detection circuit that is allowed to operate in parallel.

With reference now to FIG. 3, there is depicted a flow diagram for the logic for detecting the value of the external resistor and initializing the configuration vector for the block diagram illustrated in FIG. 2.

In the shown embodiment, the method begins at Step 302 where the circuitry waits for a configuration reset signal. The circuitry updates the configuration vector when the system has been powered on or reset. The reset configuration signal is typically the Power-on-Reset (por) signal. After receiving the reset signal, the process advances to Step 304.

In one embodiment, the method utilizes a stable reference clock to determine the external resistor value. At Step 304, the device waits for a stable clock signal before proceeding to the subsequent steps. A stable clock is signified by a phase lock loop locked signal (pll_lock).

After a stable reference clock is present, the current controlled down counter is initialized and enabled at Step 306. The initial value of the down counter is its maximum value. In other embodiments of the present invention, the down counter may be set to other values such that enable the resistor value detection circuit to identify the value of the external resistor.

The process then advances to Step 308 where the reference up-counter is initialized and enabled. The initial value of the reference up-counter is its initial value of 0.

After the counters have been enabled and initialized, the process then begins a detection loop formed from Step 310 and Step 312. At Step 310 the value of the current-controlled down-counter is compared to a termination value. In a preferred embodiment, the termination value is 0. If the value of the down-counter is not 0, the process moves to Step 312 where the reference up-counter is incremented at each reference clock signal. While the loop formed from Step 310 and Step 312 is taking place, the value of the current controlled down-counter is being decremented at the frequency of the resistor clock.

When the value of the down-counter is 0, the process moves from Step 310 to Step 314. At Step 314, the reference up-counter is disabled and the value stored in the reference up-counter is utilized in Step 316 to locate the desired configuration vector in an on-chip lookup table. The reference up-counter value is converted into a table index.

Once the configuration vector is found at Step 316 the process advances to Step 318 where the configuration vector for the integrated circuit is set to the vector that corresponds with the external resistor. Once the configuration vector is set, the process ends and the integrated circuit functions in accordance with the specified configuration vector.

Figure 4:
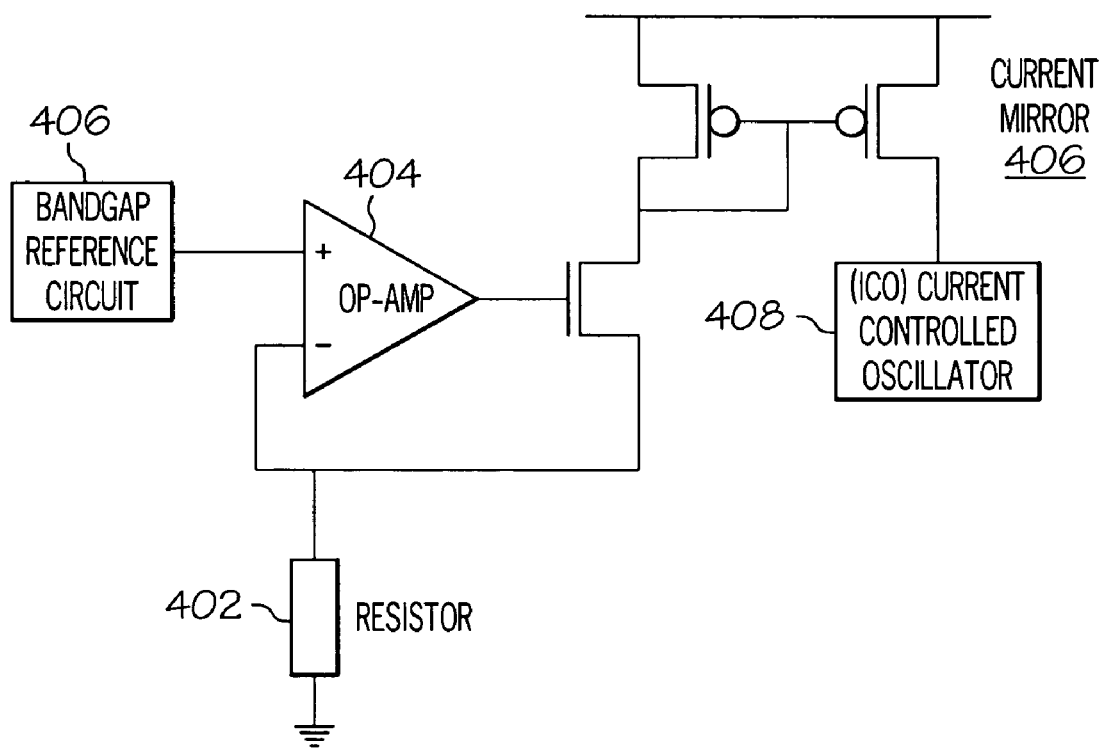
FIG. 4 shows a block diagram for a current controlled oscillator with monotonically increasing frequency for use in a preferred embodiment of the present invention.

With reference now to FIG. 4, there is shown a block diagram for a current controlled oscillator with monotonically increasing frequency for use in a preferred embodiment of the present invention.

Bandgap Reference Circuit 406 provides a constant reference voltage for use in the current controlled oscillator circuit. Bandgap Reference Circuit 406 is capable of producing a constant voltage output even with process and temperature variations. In a preferred embodiment, the constant reference voltage is 1.2V+/−20 mv. The constant voltage output is connected to Operational Amplifier 404.

Operational Amplifier 404 provides a means to place the constant 1.2V reference voltage across Resistor 402. In the embodiment shown, the voltage on top of Resistor 402 will be the same as the voltage on the positive terminal of Operation Amplifier 404

Resistor 402 is utilized to generate a current for controlling the frequency of Current Controlled Oscillator 408. The current generated follows Ohm's law of I=V/R, where V=1.2V from Bandgap Reference Circuit 406. Since the voltage is constant, Resistor 402 will control the amount of current flowing to Current Controlled Oscillator 408.

Current Mirror 406 produces a copy of the current flowing through Resistor 402. The current through the resistor is equal to the current flowing though the NMOS device on top of the resistor and also equal to the current flowing through the PMOS device on top of the NMOS device. The current is mirrored, or copied, over to the second PMOS device on the right side of Current Mirror 406.

Current Controlled Oscillator 408 generates the frequency related to Resistor 402 and the constant voltage produced by Bandgap Reference Circuit 406. The output of Current Controlled Oscillator 408 (not shown) clocks Resistor Value Detection Circuit 208 at the frequency of the resistor clock.

The oscillator may be any simple oscillator that operates at a desired range of frequencies with a controlled current. It will be readily acknowledged that variations with the manufacturing process and temperature will affect the frequency output of the oscillator with a fixed current. In some embodiments, care should be taken in oscillator design and resistor selection in order to avoid overlaps in frequency. Overlaps in frequency may be avoided by utilizing resistor values that are further apart to avoid overlaps in output frequency; however, resistor value spacing in some embodiments should not be unnecessarily far apart as that would cause the current controlled oscillator to permit operation at a wide range of frequencies.

As will be appreciated, the processes in preferred embodiments of the present invention may be implemented using any combination of computer programming software, firmware or hardware. The method form of the invention may be practiced by combining software and/or hardware to complete the steps of the invention.

While the invention has been particularly shown and described with reference to preferred embodiments, it will be understood by those skilled in the art that various changes in form and detail may be made therein without departing from the spirit and scope of the invention. Any variations, modifications, additions, and improvements to the embodiments described are possible and may fall within the scope of the invention as detailed within the following claims.

What is claimed is:

1. A system comprising:
   a configurable integrated circuit with a configuration pin; and
   a circuit connected to the configuration pin capable of generating a reference current or voltage with a predictable voltage/current relationship based on a resistance value coupled to the configuration pin; and
   a resistor value detection circuit for determining a look-up table index value in response to the reference current or voltage, wherein the resistor value detection circuit includes:
   a reference up-counter configured to be clocked at a reference clock frequency;
   a down-counter configured to be clocked at a frequency of the reference current or voltage; and
   counter control logic circuitry.

2. The system of claim 1, where the circuit connected to the configuration pin capable of generating a reference current or voltage with a predictable voltage/current relationship comprises:
   a current controlled oscillator.

3. The system of claim 1, wherein the configurable integrated circuit comprises:
   a look-up table for associating a configuration vector for the configurable integrated circuit with the reference current or voltage.

4. The system of claim 1, wherein the counter control logic circuitry comprises logic that is configured to:
   initialize the down-counter,
   initialize the reference up-counter,
   clock the down-counter,
   clock the reference up-counter, and
   disable the clocking of the reference up-counter when the down-counter reaches a termination value.

5. The system of claim 1, where the configurable integrated circuit initializes to a configuration vector associated with the reference current or voltage in response to a power-on-reset signal.

6. The system of claim 1, where the configuration vector indicates at least one of input/output bus port width and pad drive strength.

7. A configurable integrated circuit comprising:
   a configuration input pin for coupling to an external resistance element;

a circuit capable of generating a reference current or voltage with a predictable voltage/current relationship connected to the configuration input pin; and resistor value detection logic for determining an index value associated with the external resistance element, wherein the resistor value detection logic includes:
- a reference up-counter operating at a reference clock frequency;
- a down-counter operating at a frequency of a resistor clock; and
- counter control logic circuit.

8. The configurable integrated circuit of claim 7, where the circuit comprises:
a current controlled oscillator.

9. The configurable integrated circuit of claim 7, said configurable integrated circuit further comprising a look-up table for associating the index value of the external resistor with a configuration vector, wherein the configurable integrated circuit is responsive to the configuration vector to configure operation.

10. The configurable integrated circuit of claim 9, where the configuration vector indicates at least one of input/output bus port width and pad drive strength.

11. The configurable integrated circuit of claim 7, wherein the counter control logic is configured to:
initialize the down-counter,
initialize the reference up-counter,
enable the down-counter,
enable the reference up-counter; and
disable the reference up-counter when the down-counter reaches a termination value.

12. The configurable integrated circuit of claim 7, where the integrated circuit initializes to a configuration vector associated with the reference current or voltage in response to a power-on-reset signal.

13. A method for configuring an integrated circuit with a configuration vector, wherein the integrated circuit stores a plurality of configuration vector and includes a configuration pin coupled to an external resistor selected based on a desired operational configuration of the integrated circuit, said method comprising the steps of:
determining an external resistor value of the external resistor, wherein said determining an external resistor value of the external resistor comprises:
(a) initializing a down-counter;
(b) initializing a reference up-counter;
(c) enabling the down-counter;
(d) enabling the reference up-counter;
(e) incrementing the reference up-counter while the down-counter is not equal to a termination value; and
(f) disabling the reference up-counter when the down-counter reaches the termination value; and
setting a configuration of the integrated circuit to a configuration vector from among the plurality of configuration vectors that is associated with the external resistor value to place the integrated circuit in the desired operational configuration.

14. The method for configuring the integrated circuit of claim 13, said method further comprising:
converting the external resistor value into an index value suitable for indexing into a plurality of configuration value and index value pairs.

15. The method for configuring the integrated circuit of claim 14, wherein the plurality of configuration value and index value pairs is a table and the index value is an index into the table, said method further comprising:
converting a count of the reference up-counter into the index value.

16. The method for configuring the integrated circuit of claim 13, wherein the step of determining the external resistor value comprises:
decrementing the down-counter at a frequency of a resistor clock output from a current controlled oscillator controlled as a function of the external resistor value.

17. The method for configuring the integrated circuit of claim 13, wherein the step of determining the external resistor value takes place in response to a power-on-reset signal.

18. The method for configuring the integrated circuit of claim 13, where the configuration vector indicates at least one of input/output bus port width and pad drive strength.

19. A configurable integrated circuit comprising:
a configuration input pin for coupling to an external resistance element;
a circuit connected to the configuration pin capable of generating a reference current or voltage with a predictable voltage/current relationship in response to the external resistance element; and
resistor value detection logic responsive to the reference current or voltage to determine a configuration vector associated with an external resistance element coupled to the configuration input pin, wherein the resistor value detection logic includes:
a reference up-counter operating at a reference clock frequency;
a down-counter operating at a frequency associated with the reference current or voltage; and
a counter control logic circuit;
wherein the configurable integrated circuit is responsive to the configuration vector to configure operation.

20. The configurable integrated circuit of claim 19, where the circuit comprises:
a current controlled oscillator.

21. The configurable integrated circuit of claim 19, wherein said resistor value detection logic is responsive to the reference current or voltage to generate an index value associated with the external resistor, and further comprising a look-up table for associating the index value of the external resistor with a configuration vector, wherein the configurable integrated circuit is responsive to the configuration vector to configure operation.

22. The configurable integrated circuit of claim 19, where the configuration vector indicates at least one of input/output bus port width and pad drive strength.

23. The configurable integrated circuit of claim 19, wherein the counter control logic is configured to:
initialize the down-counter,
initialize the reference up-counter,
enable the down-counter,
enable the reference up-counter; and
disable the reference up-counter when the down-counter reaches a termination value.

24. The configurable integrated circuit of claim 19 where the integrated circuit initializes to a configuration vector associated with the external resistance element in response to a power-on-reset signal.

* * * * *

UNITED STATES PATENT AND TRADEMARK OFFICE
CERTIFICATE OF CORRECTION

| | |
|---|---|
| PATENT NO. | : 7,420,401 B2 |
| APPLICATION NO. | : 11/453324 |
| DATED | : September 2, 2008 |
| INVENTOR(S) | : Colin MacDonald et al. |

It is certified that error appears in the above-identified patent and that said Letters Patent is hereby corrected as shown below:

In Col. 7, line 11 (Claim 7), please insert --a-- before the word "counter".

In Col. 7, line 38 (Claim 13), please replace "vector" with --vectors--.

Signed and Sealed this

Twenty-fourth Day of March, 2009

JOHN DOLL
*Acting Director of the United States Patent and Trademark Office*